United States Patent
Mayr et al.

(10) Patent No.: US 6,677,745 B2
(45) Date of Patent: Jan. 13, 2004

(54) TEST APPARATUS FOR PARALLEL TESTING A NUMBER OF ELECTRONIC COMPONENTS AND A METHOD FOR CALIBRATING THE TEST APPARATUS

(75) Inventors: Roman Mayr, München (DE); Andreas Schellinger, München (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 10/134,132

(22) Filed: Apr. 29, 2002

(65) Prior Publication Data

US 2002/0158625 A1 Oct. 31, 2002

(30) Foreign Application Priority Data

Apr. 27, 2001 (DE) .......................... 101 21 291

(51) Int. Cl.[7] .......................... G01R 1/04; G01R 31/02
(52) U.S. Cl. .................. 324/158.1; 324/763
(58) Field of Search ................. 324/158.1, 763, 324/765; 702/85, 89, 90, 94, 95; 368/9, 107, 108, 110, 111

(56) References Cited

U.S. PATENT DOCUMENTS

| | | | | |
|---|---|---|---|---|
| 4,360,903 A | * | 11/1982 | Plachno et al. | 365/222 |
| 4,611,197 A | * | 9/1986 | Sansky | 340/522 |
| 5,032,789 A | * | 7/1991 | Firooz et al. | 324/754 |
| 5,578,932 A | * | 11/1996 | Adamian | 324/73.1 |
| 5,703,489 A | * | 12/1997 | Kuroe | 324/601 |
| 5,984,499 A | * | 11/1999 | Nourse et al. | 700/5 |
| 6,417,682 B1 | * | 7/2002 | Suzuki et al. | 324/158.1 |

FOREIGN PATENT DOCUMENTS

| | | | | |
|---|---|---|---|---|
| DE | 19939595 C1 | | 2/2001 | |
| WO | WO0135365 A1 | * | 5/2001 | G08B/19/00 |

* cited by examiner

Primary Examiner—Kamand Cuneo
Assistant Examiner—Jermele Hollington
(74) Attorney, Agent, or Firm—Laurence A. Greenberg; Werner H. Stemer; Gregory L. Mayback

(57) ABSTRACT

A method for calibrating a test apparatus for parallel testing of a number of semiconductor memories, to a time-critical parameter, in which the components are positioned in batches at predetermined test positions and the parameter is measured. The various test positions give different measurement results since they are not identical. These different measurement results are compensated for by the following steps: The invention provides for a position-specific mean value $M_{PS}$ to be formed from batch parameter measurements at each test position, for a position-independent mean value $M_{PU}$ to be formed for the batch parameter measurements at all the test positions, and for a corrected mean value to be obtained for each test position by adding a correction value $\delta$, which is determined from the difference between the position-specific mean value $M_{PS}$ and the position-independent mean value $M_{PU}$, to the position-specific mean value $M_{PS}$.

7 Claims, 7 Drawing Sheets

TEST APPARATUS FOR PARALLEL TESTING A NUMBER OF ELECTRONIC COMPONENTS AND A METHOD FOR CALIBRATING THE TEST APPARATUS

BACKGROUND OF THE INVENTION

Field of the Invention

The invention relates to a method for calibrating a test apparatus for testing a number of electronic components in parallel, in particular semiconductor memories, to a time-critical parameter. In the method, the components are positioned in batches at predetermined test positions and the parameter is measured. The various test positions give different measurement results since they are not identical and because of the different wiring to the measurement unit for measuring the parameter. These different measurement results are compensated for on the basis of forming mean values of the parameter measurements at all of the test positions.

For purposes of the present document, the expression "testing a module" means the analysis of the module with respect to a specific time-critical value in order to make a decision "test passed" or "pass", or "test failed" or "fail". In this case, the timing accuracy, the so-called OTA (Overall Timing Accuracy) of a test apparatus governs the accuracy limit to which the module, for example an SGRAM, can be qualified. The time parameters to be checked require a test system accuracy which is better than that of the time parameters to be checked by a factor of 4 to 6. Previous test apparatuses are not directly suitable for the currently existing requirements in conjunction with semiconductor memory modules, such as the SGRA 32M and 128M, since this apparatus does not ensure the abovementioned factor of 4 to 6. In principle this problem can be overcome by using of test apparatuses that provide the necessary accuracy. However, this has the disadvantage that previous test apparatuses, procured at high cost, must be replaced by new apparatuses whose measurement accuracy is better. Issued German Patent DE 199 39 595 C1 discloses a test arrangement for a large number of semiconductor circuits, in which the test signals have a specific time relationship with the system clock. In this case, the test signals are synchronized by a circuit device in the form of a semiconductor circuit.

SUMMARY OF THE INVENTION

It is accordingly an object of the invention to provide a test apparatus for measuring a time-critical parameter and a method for calibrating such a test apparatus which overcomes the above-mentioned disadvantages of the prior art apparatus and methods of this general type.

With the foregoing and other objects in view there is provided, in accordance with the invention, a method for calibrating a test apparatus for measuring a time-critical parameter for electronic components. The method includes steps of: providing a test apparatus including test positions for holding the electronic components in batches and a measurement unit to which the test positions are individually connected, the test positions having individual characteristics upon which the time-critical parameter is dependent; for each respective one of the test positions, measuring the time-critical parameter for a number of the electronic components that are temporally successively configured at the respective one of the test positions; determining a position-specific mean value for the time-critical parameter for each respective one of the test positions from measured values corresponding to the respective one of the test positions; determining a position-independent mean value for the time-critical parameter from measured values corresponding to a number of the test positions; for each one of the test positions, determining a difference between the position-specific mean value for the one of the test positions and the position-independent mean value of the time-critical parameter in order to determine an individual offset for the one of the test positions; forming a correction value for each one of the test positions from the offset of the one of the test positions; and calibrating the measurement unit using the correction value for the test positions to reduce the offset of the test positions.

In accordance with an added feature of the invention, the correction value is iteratively formed.

In accordance with an additional feature of the invention, the correction value is iteratively formed using a clock cycle that is dependent on a clock cycle of the batches.

In accordance with another feature of the invention, the correction value is formed after each batch change.

In accordance with a further feature of the invention, the electronic components are provided as semiconductor memories.

One object of the present invention is to provide a method as mentioned initially, which allows time parameters for components, in particular semiconductor memories, to be tested reliably, without having to replace previous test apparatuses by expensive, new, more accurate test apparatuses. A further object of the invention is to provide a test apparatus for carrying out the method.

In other words, the method according to the invention improves the accuracy limits of the test apparatus in the region of the so-called skew error (skew error relates to the time difference between a number of signals with respect to a specific flank, resulting from different delay times). This has the immediate advantage that previous test apparatuses can still be used, and do not need to be replaced by new ones.

In other words, the limits of previous test apparatuses in terms of the timing and calibration are extended by using a statistical method. Indeed, a component that will be tested is measured using a known best-possible time parameter, by using a search algorithm, within the accuracy limits of the test apparatus. The measurement result that is achieved using the method is based on statistically sufficient samples in order, by using mathematically known density functions, for example the Gaussian function, to improve the limit resulting from the intrinsic bandwidth of previous test apparatuses. The method allows individual test apparatus channels, or even groups of test apparatus channels, which are also referred to as test positions in this document, to be improved by factors of two or more with regard to the timing (skew).

A further advantage is that the method is not restricted to being used with a specific test apparatus, but can be used universally. The only precondition for using the method is knowledge of the calibration system for the respective test apparatus, and of the timing on the module to be measured.

In detail, the method provides, in each test position, for a position-specific mean value to be formed from batch parameter measurements, for a position-independent mean value of the batch parameter measurements to be formed at all of the test positions, and for a corrected mean value to be obtained for each test position by adding the difference between the position-specific mean value and the position-independent mean value to the position-specific mean value.

According to the invention, the position-dependent mean value of the parameter measurements is not just matched once, but by successive approximation using a progressive measurement procedure in order to improve the measurement accuracy successively. In this case, the invention provides, in particular, for the use of corrected mean values for the formation process to be updated as a function of the clock cycle of the batches. The updating clock cycle in this case preferably corresponds to the batch clock cycle.

Other features which are considered as characteristic for the invention are set forth in the appended claims.

Although the invention is illustrated and described herein as embodied in a test apparatus for parallel testing of a number of electronic components, and a method for calibration of the test apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The method for calibrating a test apparatus for parallel testing a number of electronic components, in particular semiconductor memories, to a time-critical parameter, in order to determine the "test passed" and "test failed" function provides for the components to be positioned at predetermined test positions, and for the parameters to be measured, in batches. By way of example, FIG. 1 shows a timing diagram to illustrate the recording of the time-critical parameter and of the test result derived from it.

Figure 1:
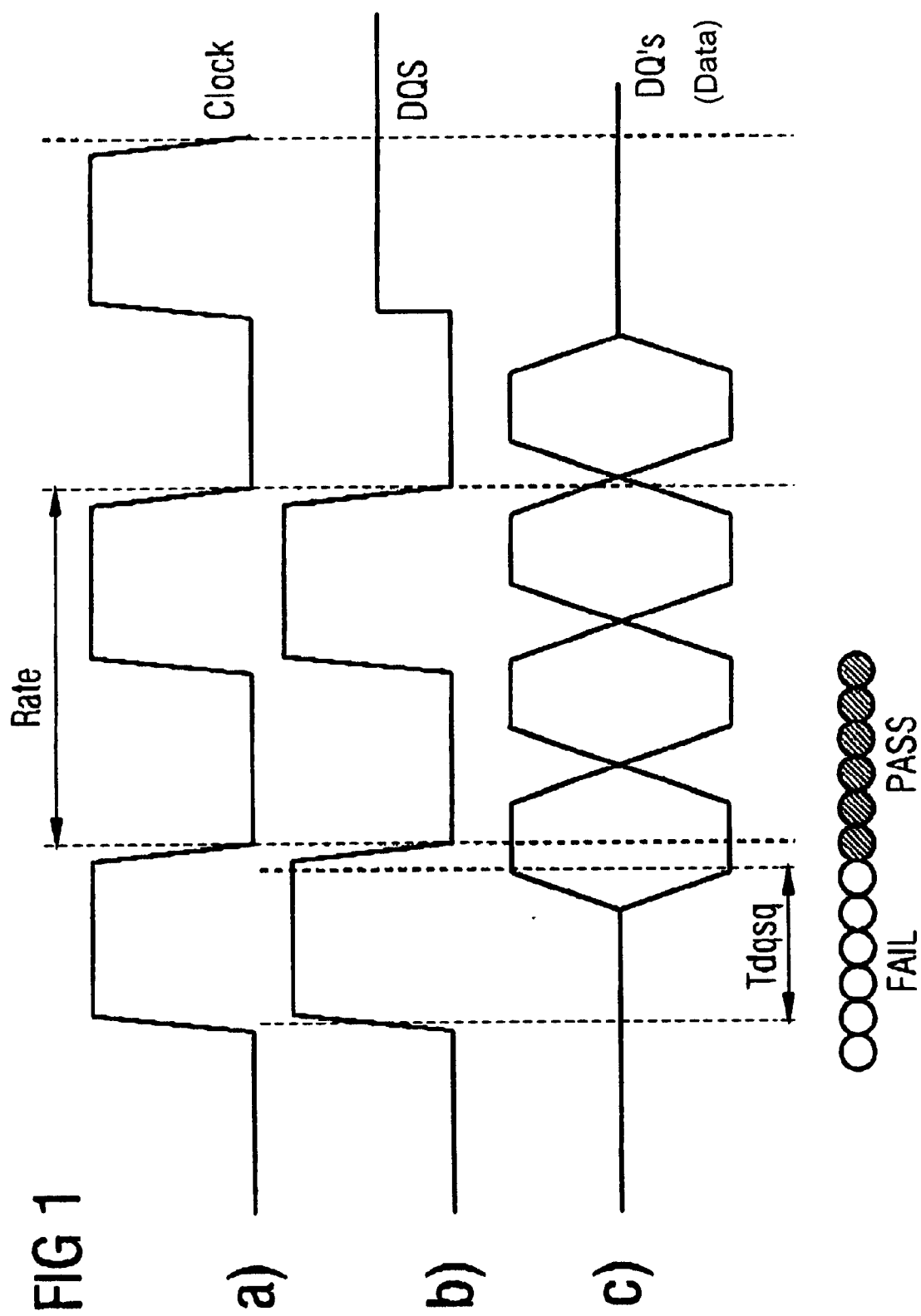
FIG. 1 is a typical timing diagram for signals for a module undergoing testing.

In FIG. 1, the signal waveform a) relates to a clock signal, the time profile b) relates to a DQS signal (DQS represents a data strobe signal) and the signal waveform c) relates to a data signal DQ. The signal period of the clock signal and of the DQS signal is indicated by a double arrow and is referred to as the rate. The time-critical parameter that is to be determined by way of example is annotated Tdqsq, and this time-critical parameter is different for each module D. In general, the time-critical parameter has a normal distribution for the modules D. This means that the values of this parameter for the tested modules D lie on a Gaussian bell-shaped curve, as is shown by way of example in FIG. 2. In the graph in FIG. 2, the time-critical parameter is plotted on the x axis, and the probability of recurrence of the respective values of the time-critical parameter is plotted on the y-axis. Furthermore, a straight line running parallel to the y-axis separates the "test passed" (pass region) region from the "test failed" or fail region. A corresponding representation of the test result is shown in FIG. 1, in the lower part of the signal waveforms, in the form of measurement points for the test apparatus, which are likewise separated between a pass region and a fail region.

The pass region denotes that region in which the tested modules comply with the technically specified requirements. The yield from a number of tested modules D is obtained by adding the number of modules which are located in the pass region. This makes it possible to calculate a mean value which is representative of a module group, and in the present case, this is referred to as the position-independent mean value.

This mean value is unique, provided testing is carried out in the same hardware environments. The expression hardware environment in the present context means the HiFix P and the electronics of the test head (for example, See FIG. 3) of a test system. However, it has been found that this mean value is shifted through a so-called offset value as soon as the modules D are tested in a different hardware environment. In the present case, this means that even very minor discrepancies from the nominal in manufacturing lead to considerable delay time differences.

Figure 3:
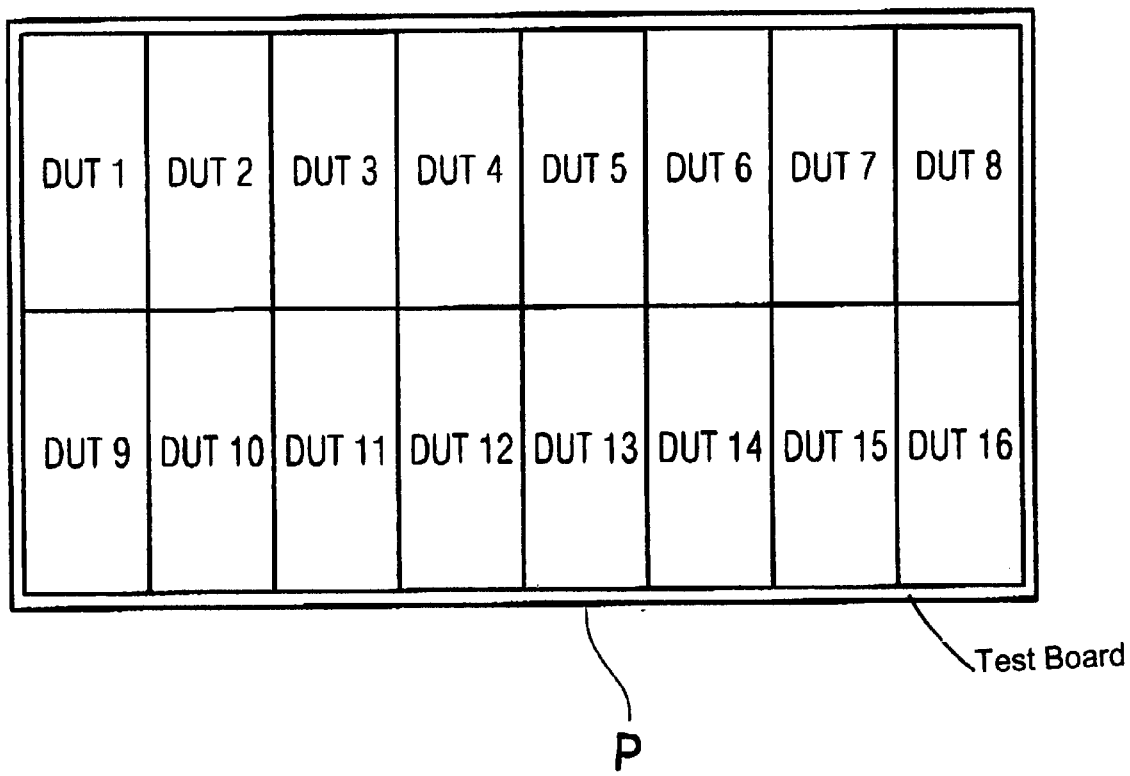
FIG. 3 is a schematic view of one embodiment of a test apparatus for testing a time-critical parameter for electronic components.

Test apparatus from different manufacturers that are used at the moment allow a number of components D to be tested in parallel on a test board P, the so-called HiFix board, which has a number of test positions. FIG. 3 shows one example of such a HiFix board. This test board P has 16 test positions DUT1 to DUT16 (DUT is an abbreviation for Device Under Test). In other words, a time-critical parameter for components D can be measured 16 times in parallel, if one component D is arranged in each of the test positions DUT1 to DUT16. The individual test positions DUT1 to DUT16 in which, typically, bases for holding the component D that will be tested are provided, are connected to a measurement unit M via wiring V (See FIG. 7, for example).

Figure 2:
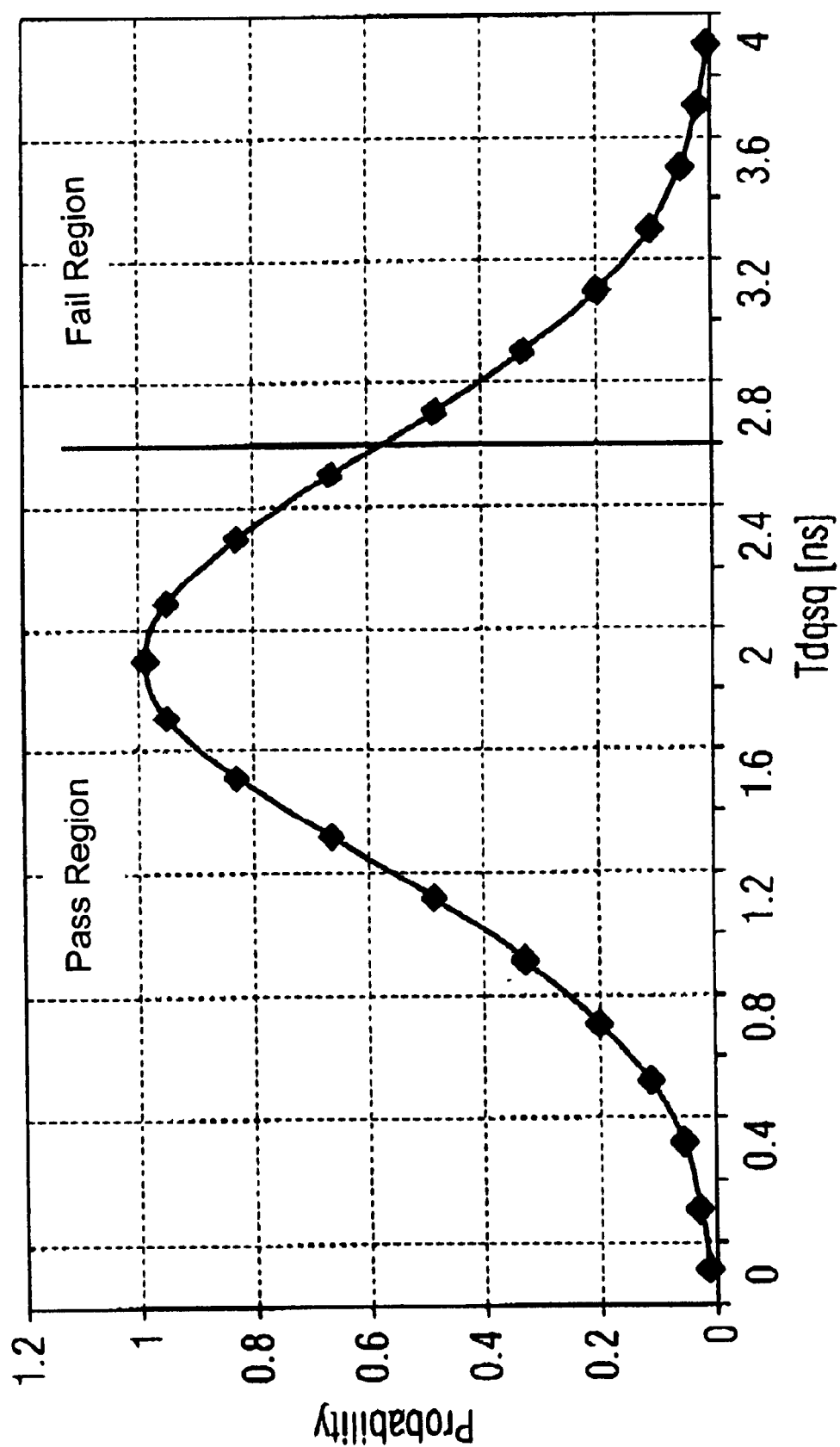
FIG. 2 is a graph showing a Gaussian distribution of a measured time-critical parameter for various modules.
Figure 4:
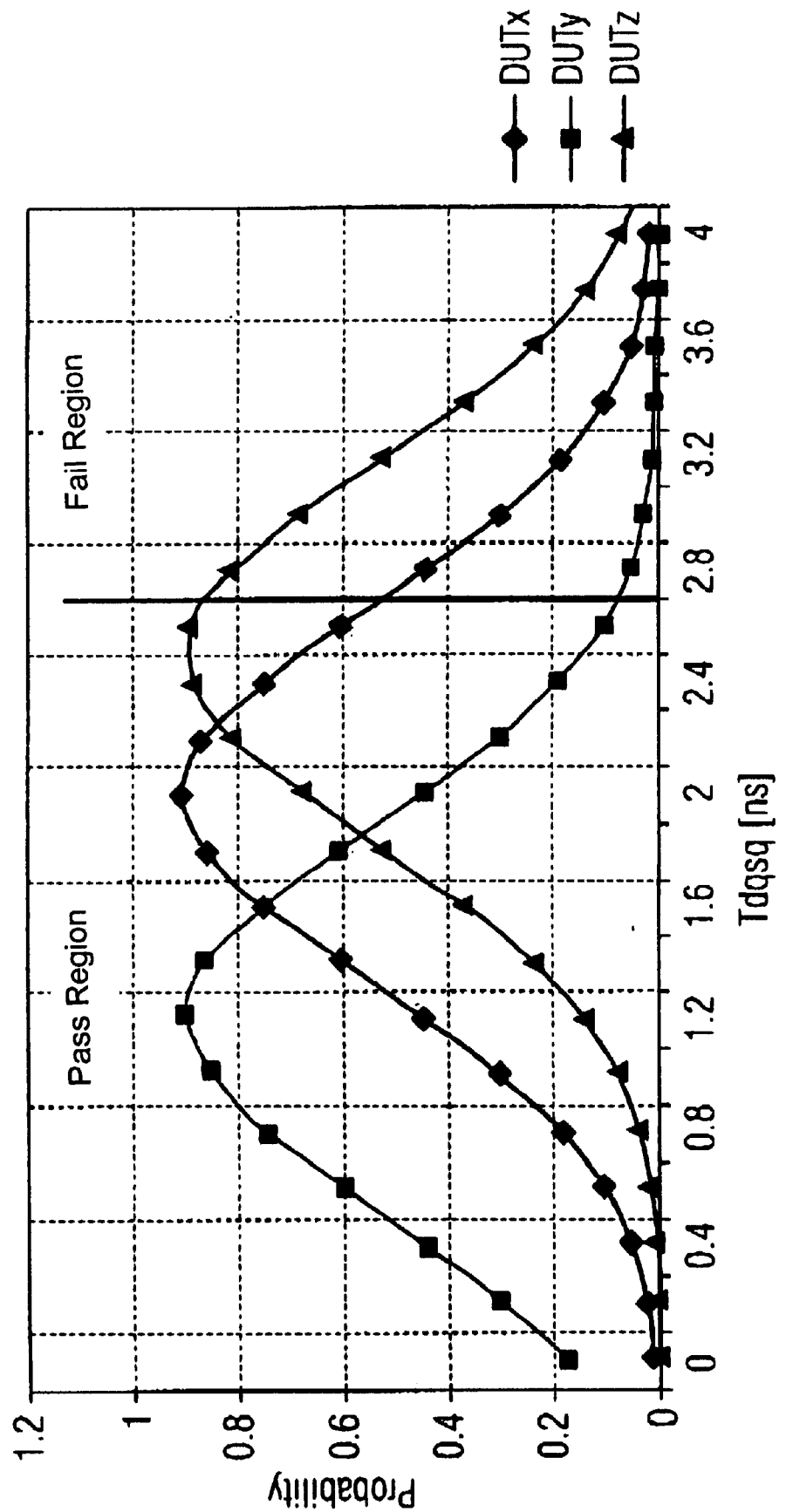
FIG. 4 is a graph showing the distribution of a measured time-critical parameter for various modules to be tested, in various test positions in the test apparatus shown in FIG. 3.

If the distribution of the measured time-critical parameters for the modules arranged in the test positions DUT1 to DUT16 is plotted as a function of the test positions DUT1 to DUT16, then this results in the normal distribution or Gaussian curve shown in FIG. 2 being shifted through a specific time difference. This is shown by way of example in FIG. 4 for three arbitrarily chosen test positions DUT1 to DUT16. These shifted normal distributions result from the fact that the test positions DUT1 to DUT16 do not have an identical hardware construction, and from the fact that the test positions DUT1 to DUT16 are connected to the measurement unit M by means of their own individual wiring V.

In order to improve quality assurance, since all of the modules D must be tested in the same conditions, it is therefore necessary to provide for the shift in the normal distributions to be cancelled out as completely as possible. Once this compensation has been carried out, the expected yield is improved, since modules D which have passed the test are in some circumstances measured as having failed the test, depending on the test position DUT1 to DUT16.

Figure 5:
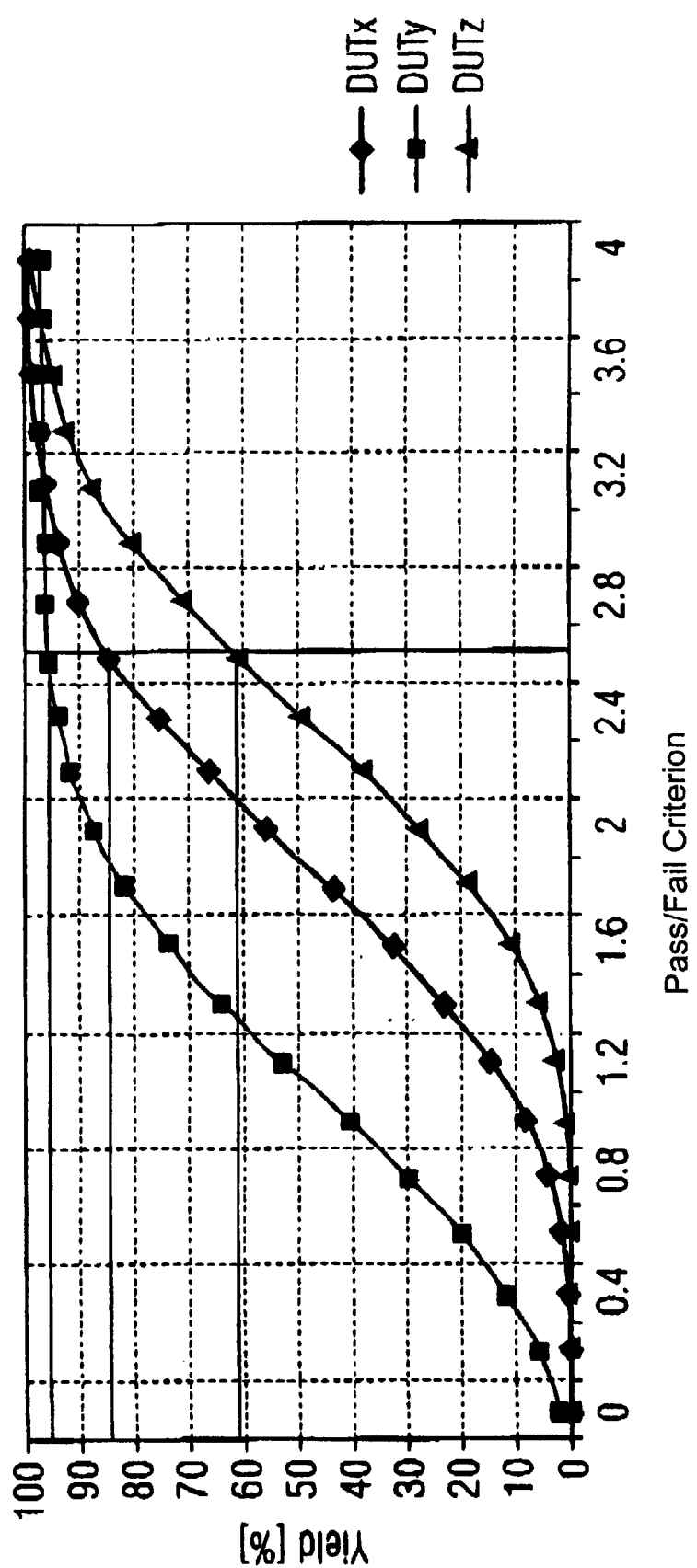
FIG. 5 is a graph showing the relationship between yields and test positions.

In this context, FIG. 5 shows the influence of the various normal distributions on the expected yield. The graph in FIG. shows the ratio of the "test passed" to the "test failed" criteria plotted on the x axis, while the yield is plotted as a percentage on the y axis, based on the shifted normal distributions in FIG. 4.

The method involves changing the calibration procedures such that the distributions are made to coincide. To this end, the invention provides for, in each test position DUT1 to DUT16, a position-specific mean value $M_{PS}$ to be formed from batch parameter measurements, for a position-independent mean value $M_{PU}$ for the batch parameter measurements to be formed at all of the test positions DUT1 to DUT16, and for a corrected mean value to be obtained for each test position. For each test position, a correction value $\delta$ is determined from the difference between the position-specific mean value $M_{PS}$ and the position-independent mean value $M_{PU}$. Then, the corrected mean value for each test position is obtained by adding the respective correction value $\delta$ to each position-specific mean value $M_{PS}$. This is preferably not achieved by a single matching process, but by successive matching in the course of the batch measurements.

Figure 6:
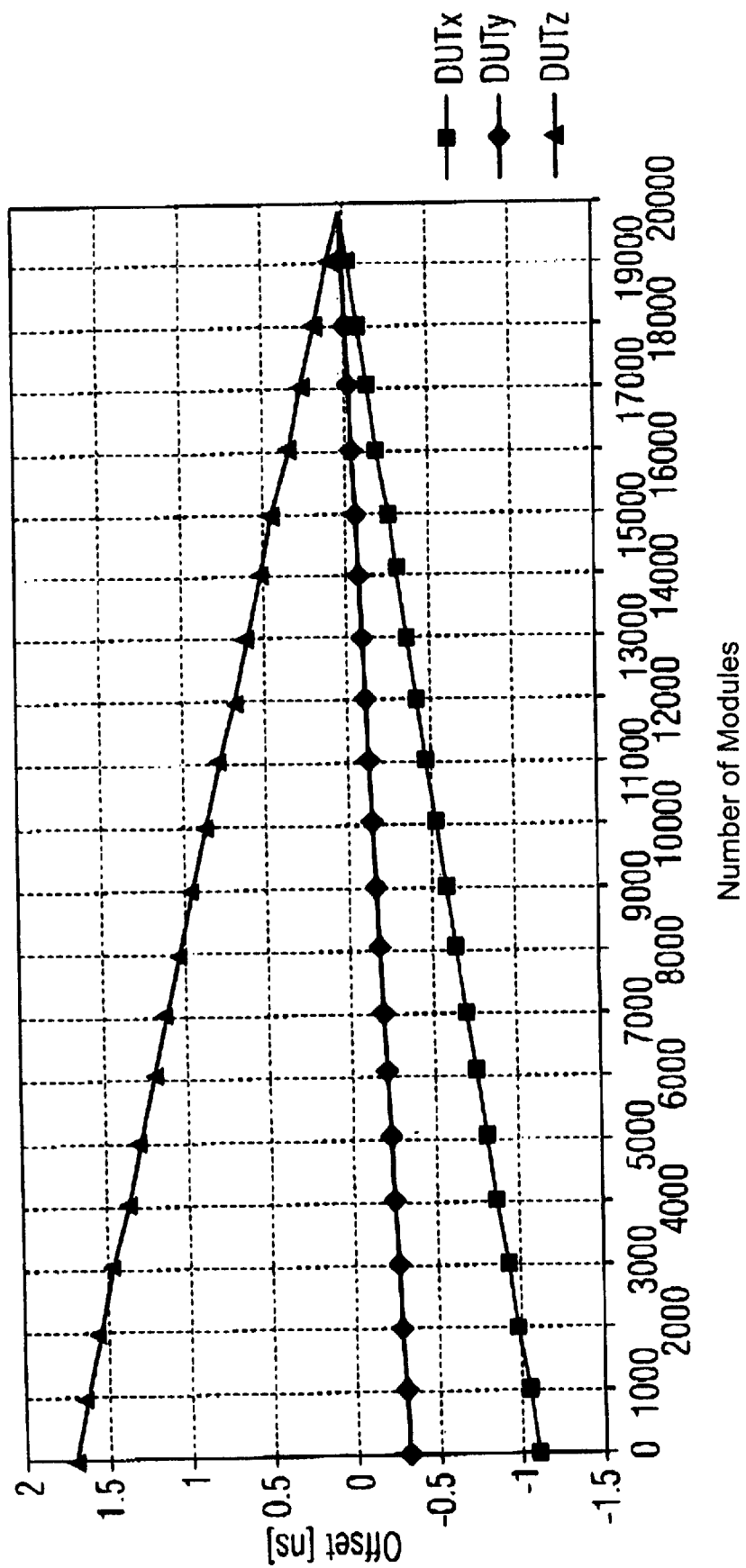
FIG. 6 is a graph showing the correction procedure for the position-dependent mean values for the individual test positions using the inventive calibration method.

FIG. 6 shows the profile for successive matching on the assumption that a stable mean value $M_{PU}$ is determined for all of the test position distributions based on a sufficiently large number of measured modules D, and is defined as being stable. This mean value is the position-dependent mean value $M_{PU}$ referred to above. In detail, the number of modules D to be tested is plotted on the x axis in the graph in FIG. 6 while the offset $\Delta$ is plotted in nanoseconds on the y axis.

Figure 7:
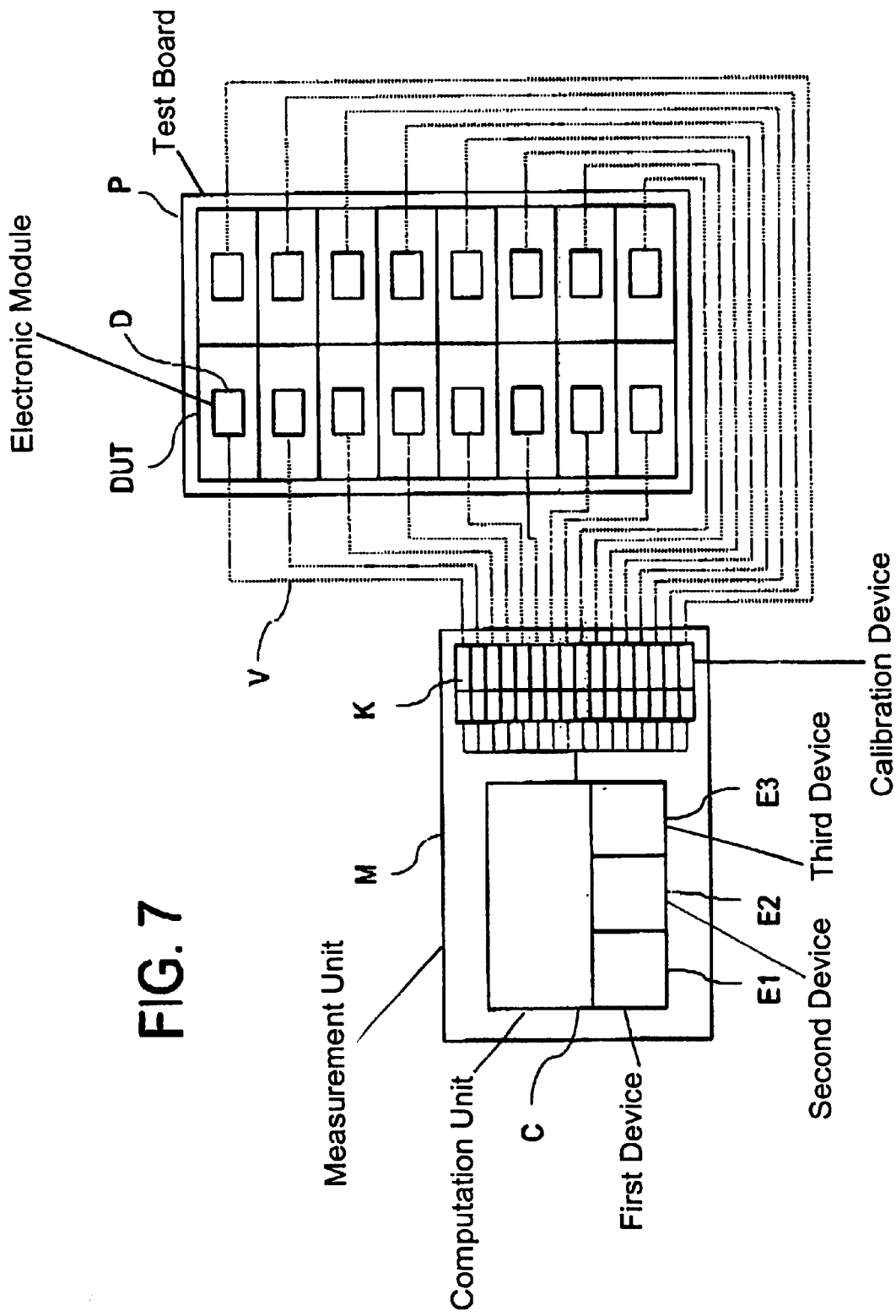
FIG. 7 is view of a test apparatus having a measurement unit that is connected to test positions by individual cables.

By way of example, FIG. 7 shows an inventive test apparatus for testing electronic modules D. The test apparatus in this case has a test board P, preferably formed with 16 test positions DUT1 to DUT16, each for holding one electronic module D, and a measurement unit M for testing the time-critical parameter for the modules D. In the exemplary embodiment illustrated in FIG. 7, each test position DUT1 to DUT16 is connected via an individual connecting cable V to a respective input/output of the measurement unit M.

The measurement unit M in this case has a computation unit C, that controls the signal transmission between the measurement unit M and the modules D accommodated in the test positions DUT1 to DUT16, in order to test a time-critical parameter relating to the modules D. For this purpose the computation unit C preferably has a first device E1 in order to determine a position-specific mean value $M_{PS}$ for the time-critical parameter for each test position DUT1 to DUT16 from the measured values for a number of modules D which are arranged successively in time in the corresponding test positions DUT1 to DUT16. Furthermore, the computation unit C preferably has a second device E2, in order to determine the position-independent mean value $M_{PU}$ for the time-critical parameter from the measured values for a number of test positions DUT1 to DUT16. The computation unit C preferably has a third device E3 for each test position DUT1–DUT16 in order to determine a correction value $\delta$ from the difference $\Delta$ between the position-specific mean value $M_{PS}$ and the position-independent mean value $M_{PU}$.

In order to calibrate the test positions DUT1 to DUT16, the measurement unit also has a calibration device K. The calibration device K is in this case preferably designed such that the time-critical parameter can be individually adapted for each test position DUT1 to DUT16 using the respective correction value $\delta$.

We claim:

1. A method for calibrating a test apparatus for measuring a time-critical parameter for electronic components, which comprises:

providing a test apparatus including test positions for holding the electronic components in batches and a measurement unit to which the test positions are individually connected, the test positions having individual characteristics upon which the time-critical parameter is dependent;

for each respective one of the test positions, measuring the time-critical parameter for a number of the electronic components that are temporally successively configured at the respective one of the test positions;

determining a position-specific mean value for the time-critical parameter for each respective one of the test positions from measured values corresponding to the respective one of the test positions;

determining a position-independent mean value for the time-critical parameter from measured values corresponding to a number of the test positions;

for each one of the test positions, determining a difference between the position-specific mean value for the one of the test positions and the position-independent mean value of the time-critical parameter in order to determine an individual offset for the one of the test positions;

forming a correction value for each one of the test positions from the offset of the one of the test positions; and calibrating the measurement unit using the correction value for the test positions to reduce the offset of the test positions.

2. The method according to claim 1, which comprises: iteratively forming the correction value.

3. The method according to claim 1, which comprises: iteratively forming the correction value using a clock cycle that is dependent on a clock cycle of the batches.

4. The method according claim 3, which comprises: forming the correction value after each batch change.

5. The method according to claim 1, which comprises: providing the electronic components as semiconductor memories.

6. A test apparatus for measuring a time-critical parameter for each one of a plurality of electronic components, comprising:
- a plurality of test positions for holding the electronic components in batches;
- a measurement unit for measuring the time-critical parameter for each one of the electronic components in said plurality of said test positions, each one of said plurality of said test positions being individually connected to said measurement unit, each one of said plurality of said test positions having individual characteristics upon which the time-critical parameter for the one of the electronic components in the one of said plurality of said test positions is dependent;
- a first device for determining a respective position-specific mean value for the time-critical parameter corresponding to each one of said plurality of said test positions from measured values obtained from a number of the electronic components that are successively temporally configured in said one of said plurality of said test positions;
- a second device for determining a position-independent mean value for the time-critical parameter from measured values corresponding to said plurality of said test positions;
- a third device for determining a correction value for each one of said plurality of said test positions from a difference between the position-independent mean value and the position-specific mean value for said one of said plurality of said test positions; and
- a calibration device for individually calibrating each one of said plurality of said test positions using the correction value corresponding to said one of said plurality of said test positions.

7. The test apparatus according to claim 6, in combination with the plurality of the electronic components, wherein: the plurality of the electronic components are a plurality of semiconductor memories.

* * * * *